US006762473B1

(12) United States Patent
Goushcha et al.

(10) Patent No.: US 6,762,473 B1
(45) Date of Patent: Jul. 13, 2004

(54) ULTRA THIN BACK-ILLUMINATED PHOTODIODE ARRAY STRUCTURES AND FABRICATION METHODS

(75) Inventors: Alexander O. Goushcha, Riverside, CA (US); Chris Hicks, Costa Mesa, CA (US); Richard A. Metzler, Mission Viejo, CA (US); Mark Kalatsky, Laguna Beach, CA (US); Eddie Bartley, Long Beach, CA (US); Dan Tulbure, Coto de Caza, CA (US)

(73) Assignee: Semicoa Semiconductors, Costa Mesa, CA (US)

( * ) Notice: Subject to any disclaimer, the term of this patent is extended or adjusted under 35 U.S.C. 154(b) by 0 days.

(21) Appl. No.: 10/606,053

(22) Filed: Jun. 25, 2003

(51) Int. Cl.$^7$ ................................................. H01L 31/00
(52) U.S. Cl. ..................... 257/443; 257/448; 250/214.1
(58) Field of Search ......................... 250/214.1, 370.11; 257/443–448, 460–465, 88–89

(56) References Cited

U.S. PATENT DOCUMENTS

| 6,184,100 | B1 | * | 2/2001 | Arai ........................... 438/328 |
| 6,426,991 | B1 | * | 7/2002 | Mattson et al. ................ 378/19 |
| 6,653,164 | B2 | * | 11/2003 | Miida .......................... 438/57 |
| 2002/0020846 | A1 | * | 2/2002 | Pi et al. ......................... 257/88 |
| 2002/0058353 | A1 | * | 5/2002 | Merrill ......................... 438/57 |
| 2002/0148967 | A1 | * | 10/2002 | Iwanczyk et al. ...... 250/370.11 |
| 2003/0209652 | A1 | * | 11/2003 | Fujii et al. ................ 250/214.1 |

FOREIGN PATENT DOCUMENTS

JP         09321265    * 5/1996

OTHER PUBLICATIONS

Derenzo, Stephen E., "Initial Characterization of a BGO–Photodiode Detector for High Resolution Positron Emission Tomography", Feb. 1984, IEEE Transactions on Nuclear Science, vol. NS–31, No. 1, pp. 620–626.

Takahashi, Tetsuhiko et al., "Design of Integrated Radiation Detectors with a–Si Photodiodes on Ceramic Scintillators for use in X–Ray Computed Tomography", Jun. 1990, IEEE Transactions on Nuclear Science, vol. 37, No. 3, pp. 1478–1482.

Burns, H. N. "Buck" et al., "Compact, 625–channel scannerless imaging laser radar receiver", 1996, Proc. SPIE, vol. 2748, pp. 39–46.

(List continued on next page.)

*Primary Examiner*—Savitri Mulpuri
(74) *Attorney, Agent, or Firm*—Blakely, Sokoloff, Taylor & Zafman LLP

(57) ABSTRACT

Ultra thin back-illuminated photodiode array structures and fabrication methods. The photodiode arrays are back illuminated photodiode arrays having a substrate of a first conductivity type having first and second surfaces, the second surface having a layer of the first conductivity type having a greater conductivity than the substrate. The arrays also have a matrix of regions of a first conductivity type of a higher conductivity than the substrate extending from the first surface of the substrate to the layer of the first conductivity type having a greater conductivity than the substrate, a plurality of regions of the second conductivity type interspersed within the matrix of regions of the first conductivity type and not extending to the layer of the first conductivity type on the second surface of the substrate, and a plurality of contacts on the first surface for making electrical contact to the matrix of regions of the first conductivity type and the plurality of regions of the second conductivity type.

20 Claims, 9 Drawing Sheets

OTHER PUBLICATIONS

Iwanczyk, J.S. et al., "Simulation and modelling of a new silicon X-ray drift detector design for synchrotron radiation applications", 1996, Nuclear Instruments and Methods in Physics Research, Section A, vol. 380, pp. 288–294.

Kwa, Tommy A. et al., "Backside–Illuminated Silicon Photodiode Array for an Integrated Spectrometer", May 1997, IEEE Transactions on Electron Devices, vol. 44, No. 5, pp. 761–765.

Holland, S.E. et al., "Development of Low Noise, BackSide Illuminated Silicon Photodiode Arrays", Jun. 1997, IEEE Transactions on Nuclear Science, vol. 44, No. 3, pp. 443–447.

Patt, B.E. et al., "High Resolution CsI(Tl)/Si–PIN Detector Development for Breast Imaging", Aug. 1998, IEEE Transactions on Nuclear Science, vol. 45, No. 4, pp. 2126–2131.

Vishay Semiconductors S268P Data Sheet, "Silicon PIN Photodiode Array", May 20, 1999, Document No. 81538, pp. 1–5.

Detection Technology, Inc., "New Photodiode Array Products for Computer Tomography–Detectors", News Bulletin for the Customers and Cooperation Partners, Winter 2000–2001.

Patt, B.E. et al., "Fast–Timing Silicon Photodetectors", Jun. 2000, IEEE Transactions on Nuclear Science, vol. 47, No. 3, pp. 957–964.

Hamamatsu Photonics K.K., Solid State Division, "Si Photodiode Catalog", Feb. 2002, pp. 1–25.

Tornai, Martin P. et al., "A novel silicon array designed for intraoperative charged particle imaging", Nov. 2002, Medical Physics, vol. 29, No. 11, pp. 2529–2540.

Luhta, Randy et al., "Back Illuminated Photodiodes for Multislice CT", Feb. 15–20, 2003, San Diego, California USA.

* cited by examiner

ULTRA THIN BACK-ILLUMINATED PHOTODIODE ARRAY STRUCTURES AND FABRICATION METHODS

BACKGROUND OF THE INVENTION

1. Field of the Invention

The present invention relates to semiconductor photodiodes, and in particular, to the structures of high performance, back-illuminated photodiode arrays and the methods of fabricating such structures.

2. Prior Art

Conventional photodiode array structures are based on either front illuminated or back illuminated technologies. FIG. 1a is a simplified cross section of an exemplary prior art front illuminated photodiode array and FIG. 1b is a simplified cross section of an exemplary prior art back illuminated photodiode array. The substrate 1 may be either n-type or p-type material, with opposite conductivity type diffused regions 2 therein. This creates a p-on-n or n-on-p structure, respectively. The anode metal pads 3 for the p-on-n structure (the cathode contacts for the n-on-p structure) are always on the device front surface. The opposite polarity electrode is usually deposited (plated, sputtered, or evaporated) on the chip back side in the case of the front illuminated structure (see metal layer 4, FIG. 1a), or is made on the device front surface (see metal pads 4, FIG. 1b) using metallized through vias 6,7 in the case of the back illuminated structure. The blanket-type implantation 5 of the back surface of the die of the same conductivity type as the substrate improves both the charge collection efficiency and DC/AC electrical performance of the devices.

Each of the two approaches—the front illuminated and back illuminated structures—has its own advantages and disadvantages. For example, traditional front illuminated structures like that shown in FIG. 1a allow building high performance photodiodes and photodiode arrays, but impose severe constraints on the metal run width. Those constraints limit a design of the front illuminating photodiode array to the use of either a smaller number of elements, or larger gaps between adjacent elements. Note that the metal runs should be accommodated in between adjacent diffusion areas 2 (see FIG. 1a).

Back illuminated structures reported recently by several companies take advantage of solder bump technology to electrically connect elements of the array to an external substrate or PC board using the contacts (bumps) on the front surface of the structure. By utilizing solder bump technology, the metal interconnects, which usually reside on top of the active surface between the adjacent elements openings, may be moved to the substrate or PC board upon which the chip is mounted. Such an approach allows minimizing the gaps between adjacent elements of the array, at the same time allowing a virtually unlimited total number of elements. However, several drawbacks of the previously reported back illuminated structures limit their application:

1) First, these structures are usually fabricated using relatively thick wafers (>50 $\mu$m) and the resistivity of the material has to be high enough (>1000 Ohm-cm) to deplete the entire volume at zero bias, which is required for many applications;
2) Second, the application of a high resistivity material usually diminishes the photodiode performance with respect to the leakage current and shunt resistance;
3) Third, if a high resistivity material is not used, then the time response will be very long (micro seconds or even longer) because the time response would be determined by the diffusion processes rather than drift processes of the totally depleted structures;
4) Fourth, there are little or no structural features that isolate adjacent cells from each other within the entire thickness of the device, which results in relatively high cross-talk, especially at zero bias.

Summarizing, such parameters as the leakage current, shunt resistance, cross-talk, spectral sensitivity, and temporal response are of main concern for the prior art of back illuminated structures. Additionally, the handling of thin wafers (<50 $\mu$m thickness) in the wafer fabrication process is a matter of great concern by itself, and would become increasingly important with the further decrease of the wafer thickness.

BRIEF DESCRIPTION OF THE DRAWINGS

The main ideas of the invention are demonstrated by the accompanying drawings, in which.

SUMMARY OF THE INVENTION

The objectives of the present invention include:

1) To provide a multiple element, back side illuminated 2D-photodiode array with a superior performance of all elements;
2) To provide a fabrication method for the back side illuminated photodiode array on an ultra thin wafer.

It is therefore an object of this invention to provide a structure for silicon multi-element, 2-D photodiode arrays having greatly improved characteristics over prior art arrays, making it useful in such applications as CT scanner applications, etc.

Another object is to provide a method of fabricating Si devices on ultra thin wafers, which method can be suitable for fabrication of flip-chip, multi-element, 2-dimensional arrays of silicon photodiodes.

These and other objects of the present invention will become apparent from the following disclosure. In this disclosure, first preferred embodiments of finished diode arrays will be described, and then the preferred method of fabricating the arrays will be described.

Detailed Description of the preffered Embodiment

Figure 1A:
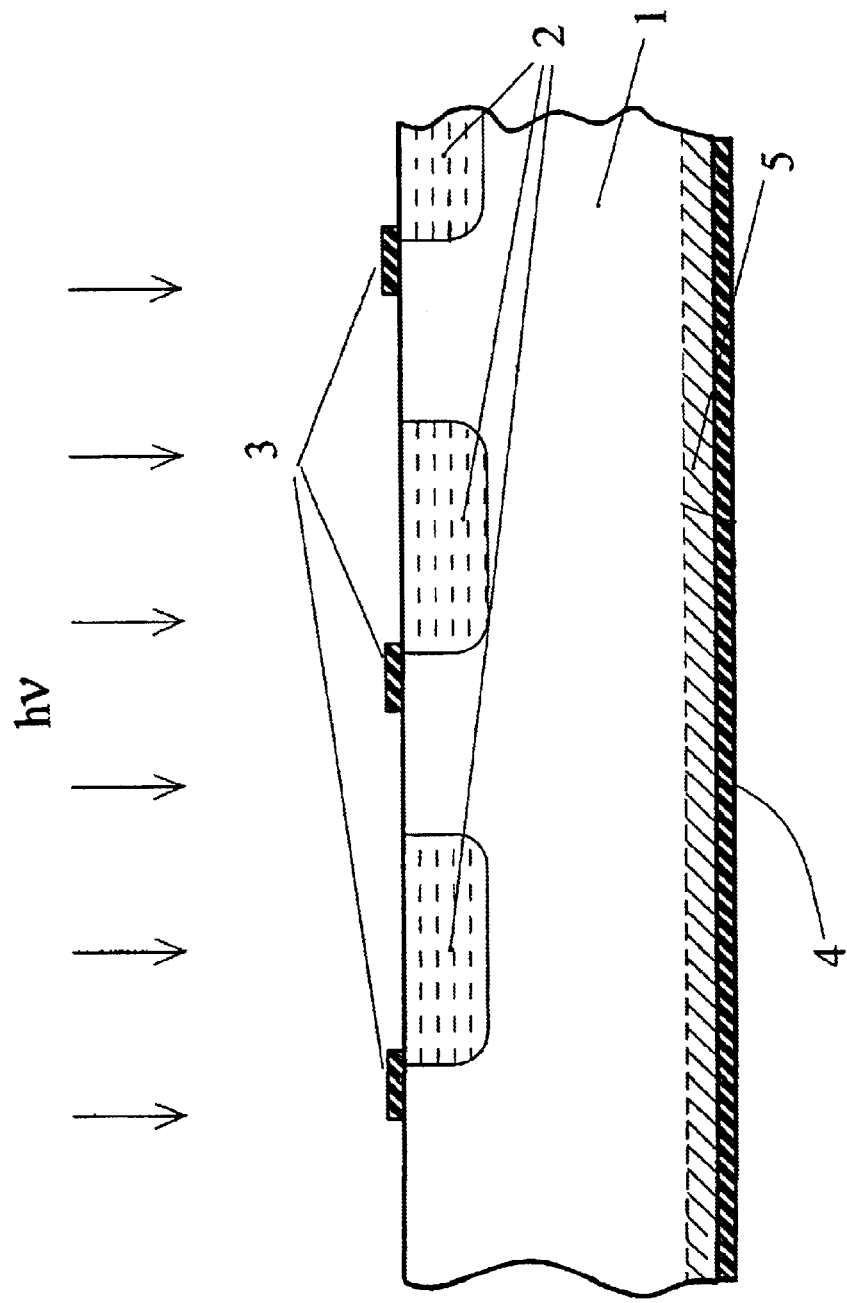
FIGS. 1a and 1b are schematic cross sections of typical, conventional prior art structures for the front illuminated photodiode arrays and back illuminated photodiode arrays, respectively.
Figure 1B:
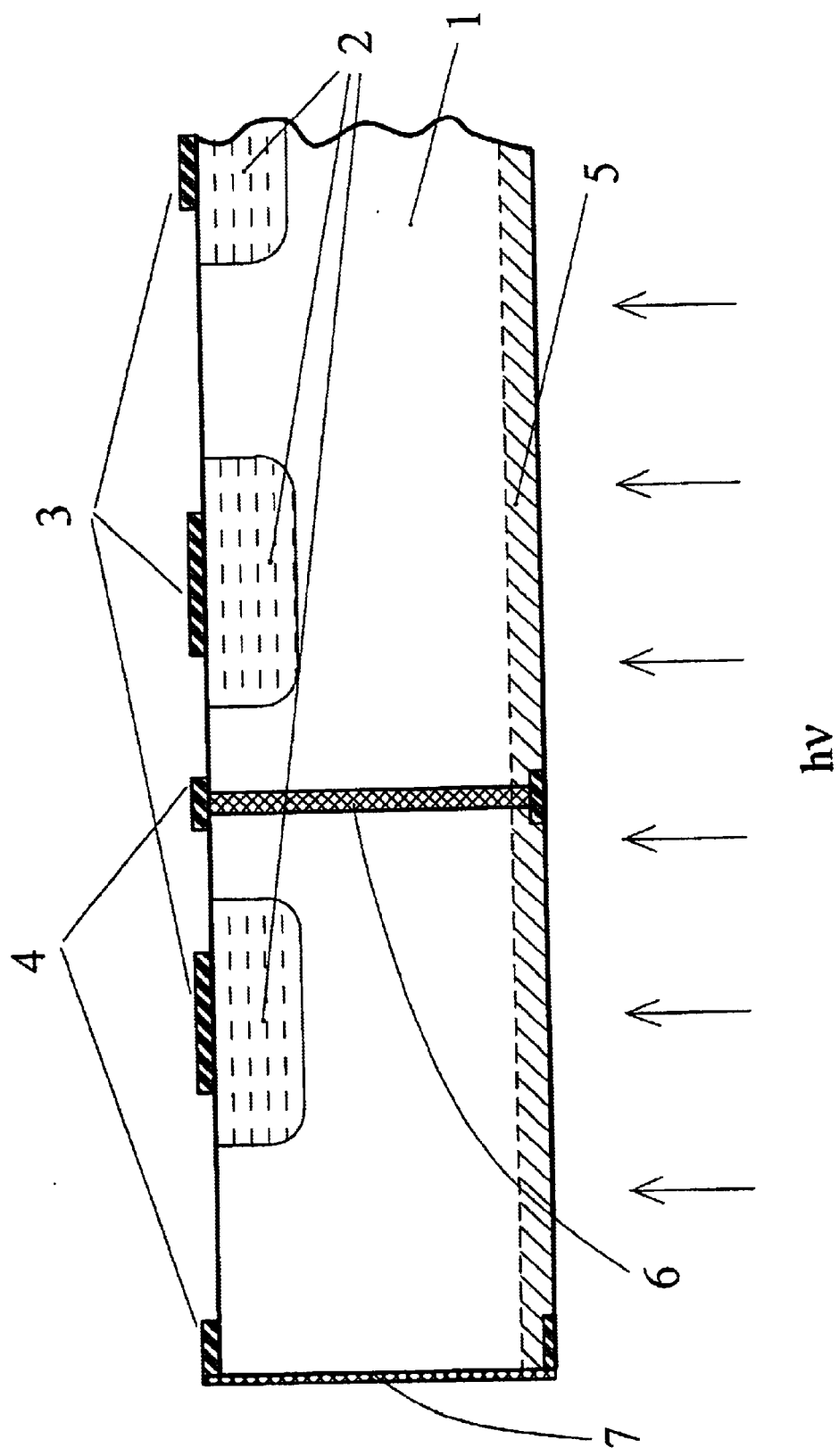
Figure 2:
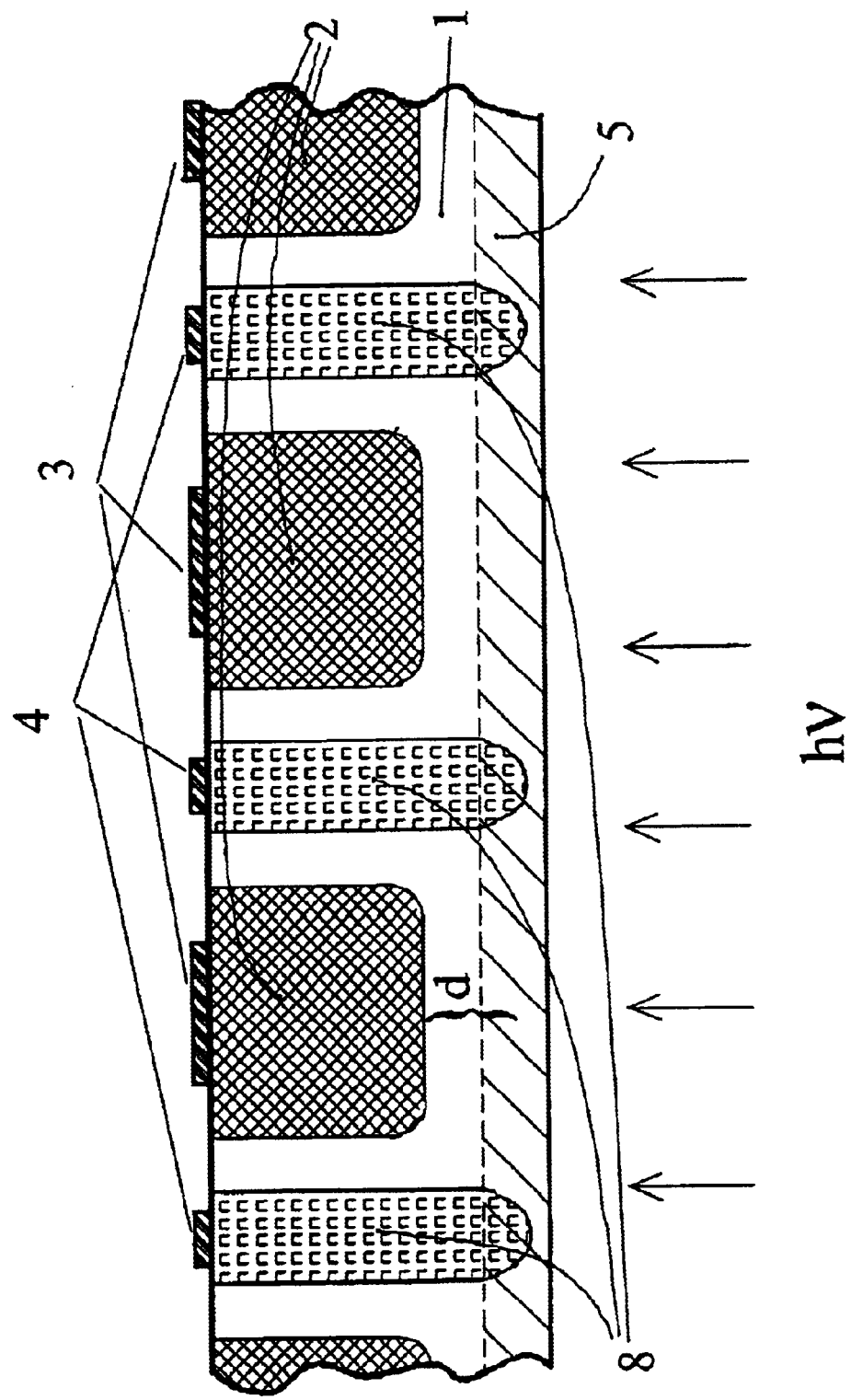
FIG. 2 is a schematic cross section of an ultra thin, back illuminating photodiode array in accordance with the present invention.

FIG. 2 is a simplified cross-sectional view of a semiconductor ultra-thin chip photodiode array in accordance with a preferred embodiment of the present invention. The structure is built using either n-type or p-type bulk silicon 1. For brevity, the anode in the case of p-on-n structure or the cathode in the case of n-on-p structure will be referred to as "the first electrode", while the cathode in the case of p-on-n structure and the anode in the case of n-on-p structure will be referred to as "the second electrode."

Figure 6:
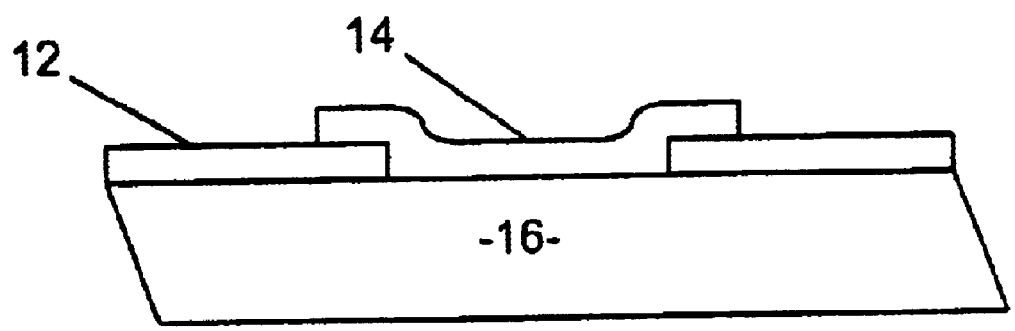
FIG. 6 is a cross section taken through one of the metal contacts of FIG. 5.

The material resistivity, thickness of the wafer/die, dopants concentrations and doses, and diffusion conditions are preferably chosen to satisfy the following requirements:

a) The active area (the first electrode) diffusion 2 extends sufficiently close to the back surface of the finished die that the rest of the volume between the diffusion edge and the blanket implant in the die back surface and part of the blanket implant, the space indicated as "d" in the FIG. 2, becomes completely depleted at a zero volt bias;

b) The uniform, "blanket" type implantation 5 of the back side of the wafer with the implant of the same polarity as the one of the majority carriers of the wafer bulk 1 provides excellent majority carrier conductivity across the wafer back side; and ensures a vertical electric field for carrier collection beneath the first electrode to minimize cross talk;

c) The second electrode, diffusion 8, is applied from the front surface of the wafer using the implantation and drive protocols that allow for the diffusion to reach the wafer back side, overlapping thereby with the blanket implantation 5 and providing perfect electrical contacts between the second electrode network across the entire wafer. At the same time, an oxide layer 12 is grown on the front surface, shown in FIG. 6, but not shown in the earlier Figures for clarity in the illustrations of the doped regions.

Figure 3:
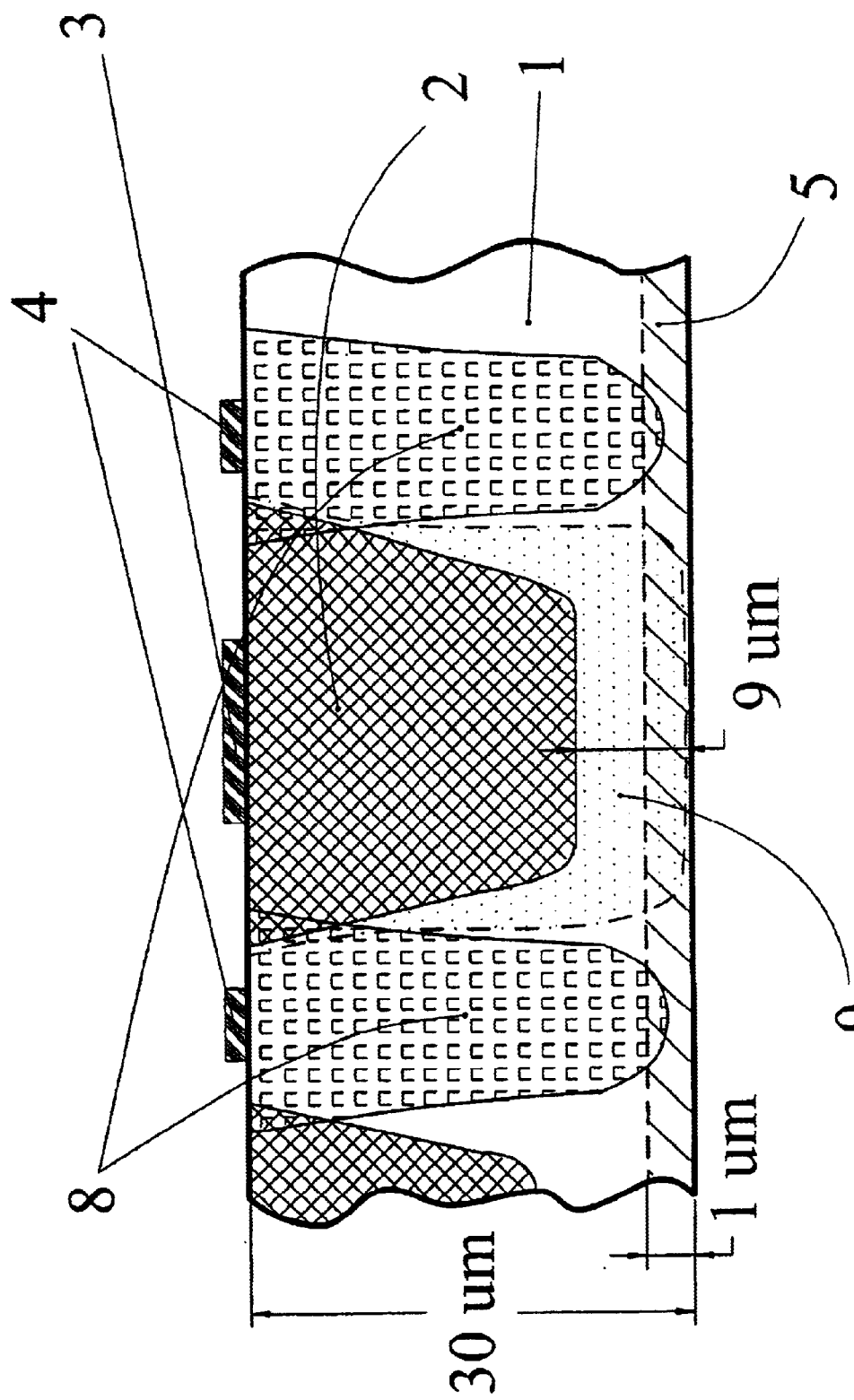
FIG. 3 is a schematic cross section of a sample structure of the present invention having a 30 $\mu$m thick, n-type Silicon wafer.

An example of a real structure built using a n-type bulk Si with the resistivity of approximately 400 ohm-cm is shown schematically in FIG. 3. At a zero bias, the width of a depletion region is approximately 9 $\mu$m and extends up to and into (but not through) the blanket implantation 5 in the wafer back side. (See the hatched with dots area 9 in FIG. 3. The blanket diffusion 5 is only approximately 0.6 $\mu$m thick, so the depletion region extends approximately to, but not quite all the way to, the wafer back side.) The built-in potential creates an electric field across the depletion region and facilitates rapid collection of non-equilibrium carriers created by light near the back surface of the die. The non-equilibrium carriers have no or very little possibility of being collected by the electrodes from adjacent cells because:

The electric field near the die back surface, where the carriers photo-generation predominantly occurs is directed perpendicular to the die surface; therefore, the carriers move (drift) primarily toward the junction of the same cell, having almost no possibility of being trapped by an adjacent cell;

The second electrode diffusion region 8, which is n+diffusion in the case of FIG. 3, spans the entire thickness of the die and acts as an effective carrier isolator from adjacent cells.

The first electrode diffusion 2 may overlap with the second electrode diffusion 8 close to the front surface of the die as shown in FIG. 3. This overlapping may significantly decrease the breakdown voltage, which is not important for a zero bias device.

Thus, exemplary representative diffusion profiles of the first electrode 2 and second electrode 8 are shown in FIG. 3. The depth of the first electrode diffusion 2 should be less than the finished substrate thickness (typically less than 50 $\mu$m, and more typically approximately 30 $\mu$m as shown in FIG. 3) by an amount that approximately equals the depletion depth for the substrate material 1 at zero bias. The second electrode diffusion 8 should span the entire thickness of the substrate, or at least to a sufficient depth to provide a reliable low resistance contact with the blanket implantation 5 of the back side of the wafer. Note that the dopants 5 and 8 are of the same polarity.

Figure 4A:
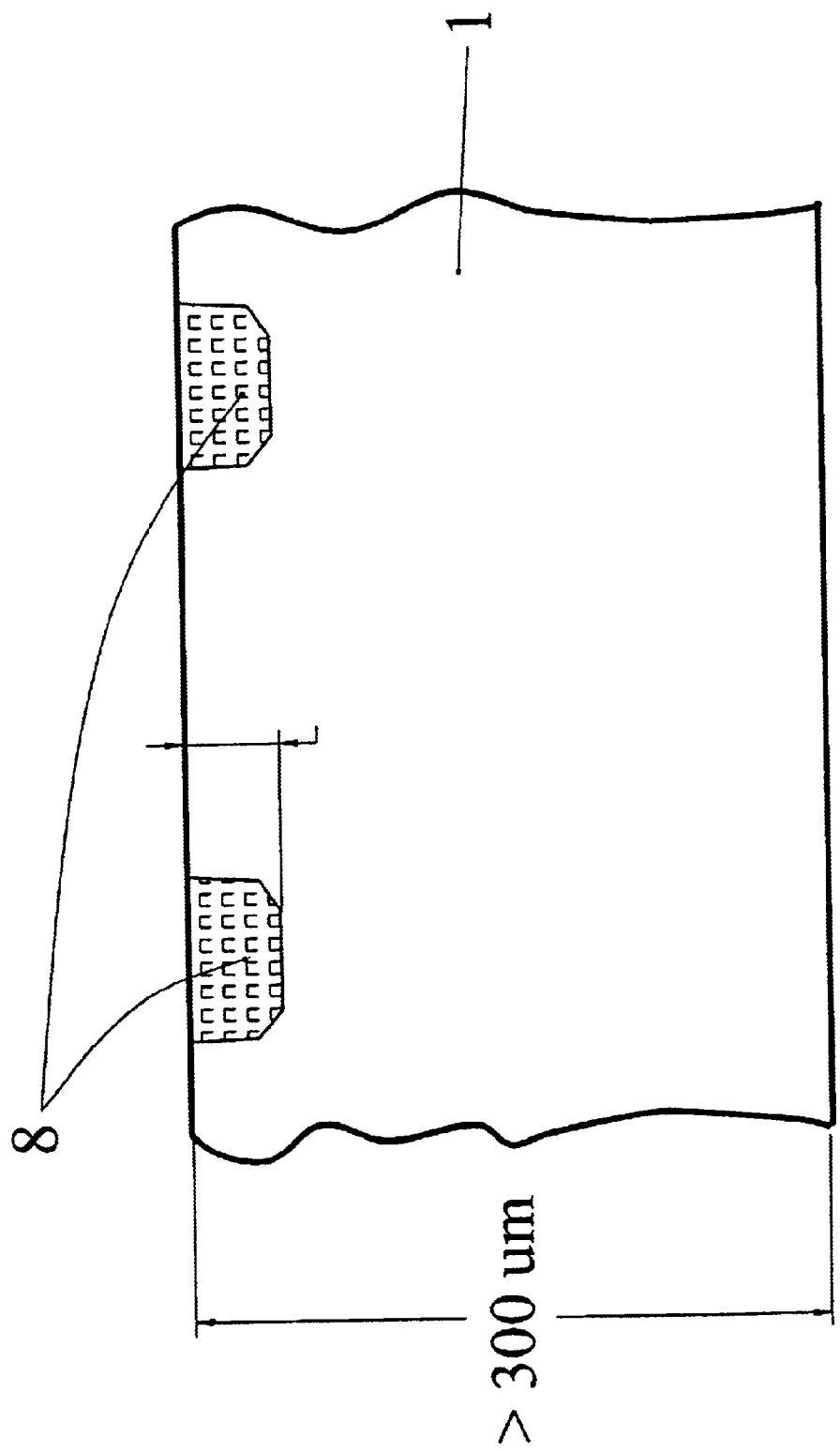
FIGS. 4a through 4c illustrate sequential steps of a method for fabricating electrodes of a thin wafer photodiode array structure in accordance with the present invention.

Such a structure may be fabricated starting with a thicker substrate (for example 300 $\mu$m) for structural stiffness and integrity during the processing, using three masking steps:

First, as shown in FIG. 4a, the second electrode 8 implantation/diffusion is applied followed by a drive. At this stage, the difference in the final diffusion depths for the first electrodes 2 and second electrodes 8 (approximately 9 $\mu$m) is formed.

Figure 4B:
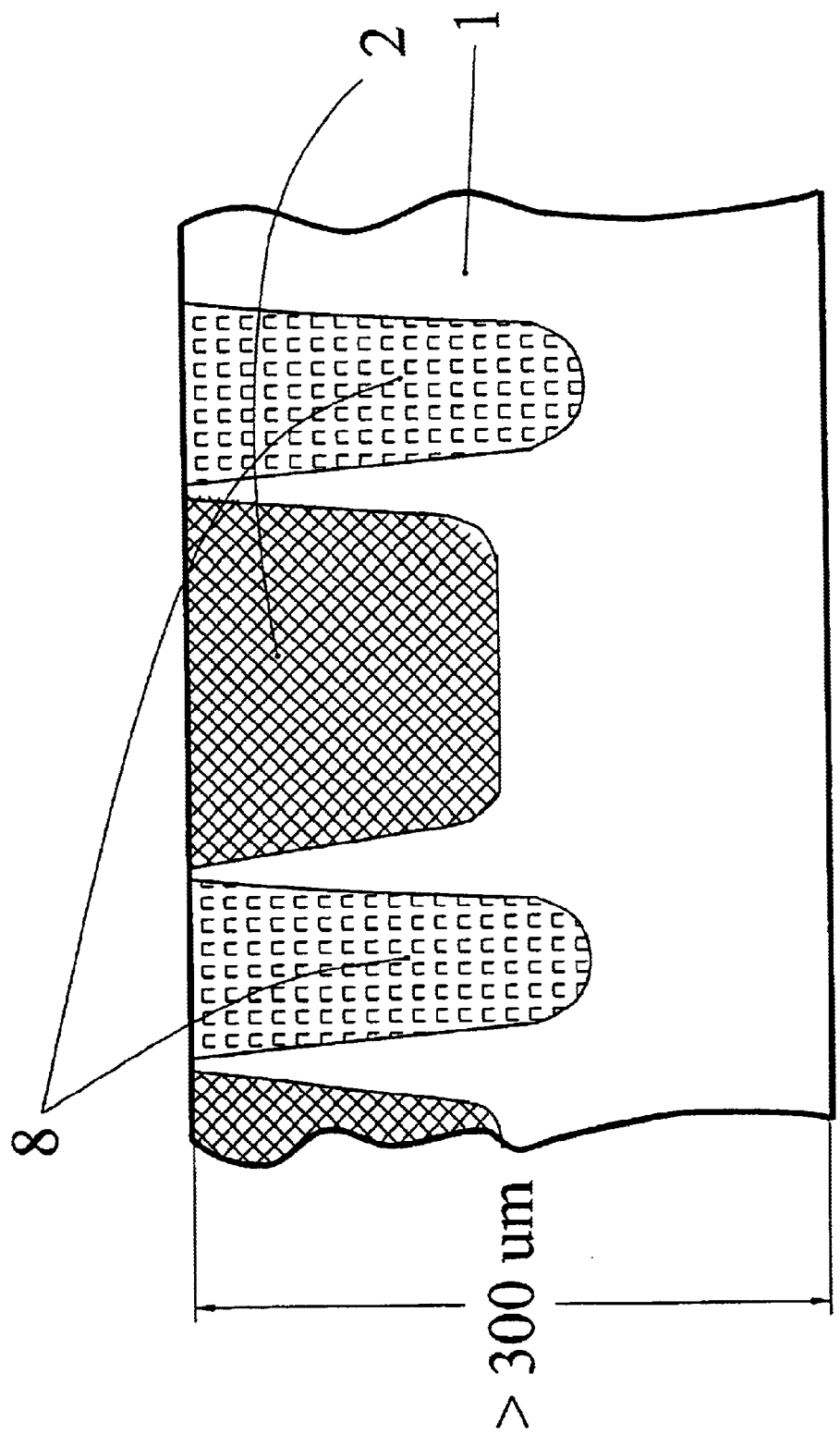

Second, as shown in FIG. 4b, the first electrode 2 implantation/diffusion is applied followed by a drive. By the end of this stage, the diffusion profiles 2 and 8 almost reach their final configuration.

Figure 4C:
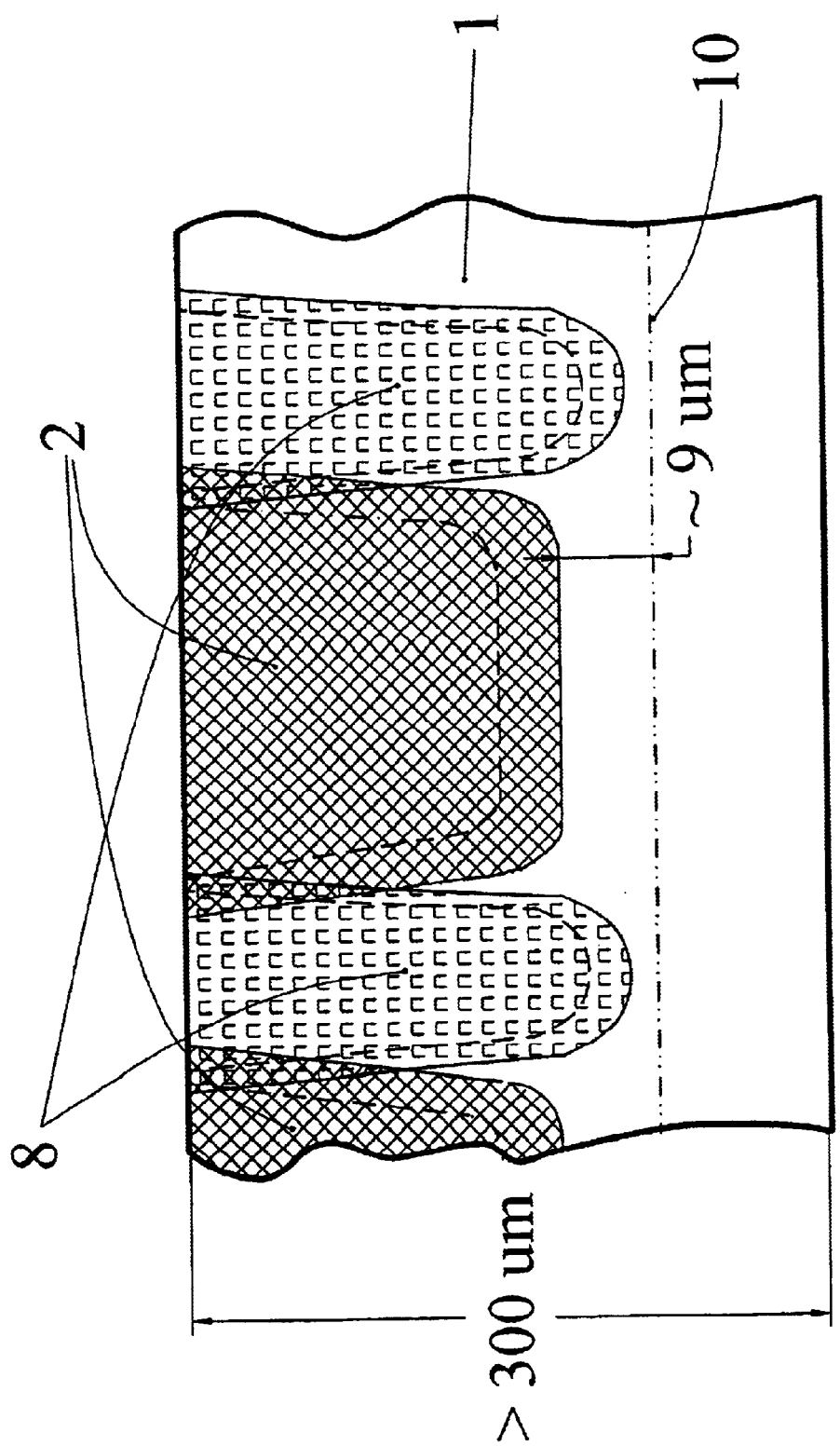

Third, as shown in FIG. 4c, the second electrode 8 receives an additional enhancement followed by a drive to ensure superior electrical contacts and to activate dopants. At this stage, the profiles of both the cathode and anode diffusions reach their final configurations (see the solid lines and hatched areas in FIG. 4c). The diffusion profiles prior to this third step of dopants implantation/diffusion/drive are shown schematically with the dashed lines in FIG. 4c. The future back surface of the wafer after back side grinding and polishing is shown schematically with the dashed line 10.

The array is then reduced in thickness by grinding the back side of the array, preferably to provide a substrate thickness of under approximately 50 $\mu$m, and more preferably to approximately 30 $\mu$m. The final thickness achieved, of course, is preferably selected in accordance with the resistivity of the substrate and the depth of the first electrode diffusion so that the diffusion is spaced away form the back side of the substrate an amount that approximately equals the depletion depth for the substrate material at zero bias. Then a blanket implant of the first conductivity type is made to the back side of the wafer, which implant improves both the charge collection efficiency and DC/AC electrical performance of the photodiode arrays. Activation of the implant does not significantly alter the first and second electrode diffusions. Alternatively, a diffusion for the back side could be used if desired. The blanket implant is quite thin compared to the depletion region, with the depletion region extending into, but not through, the blanket implant in the final array.

Figure 5:
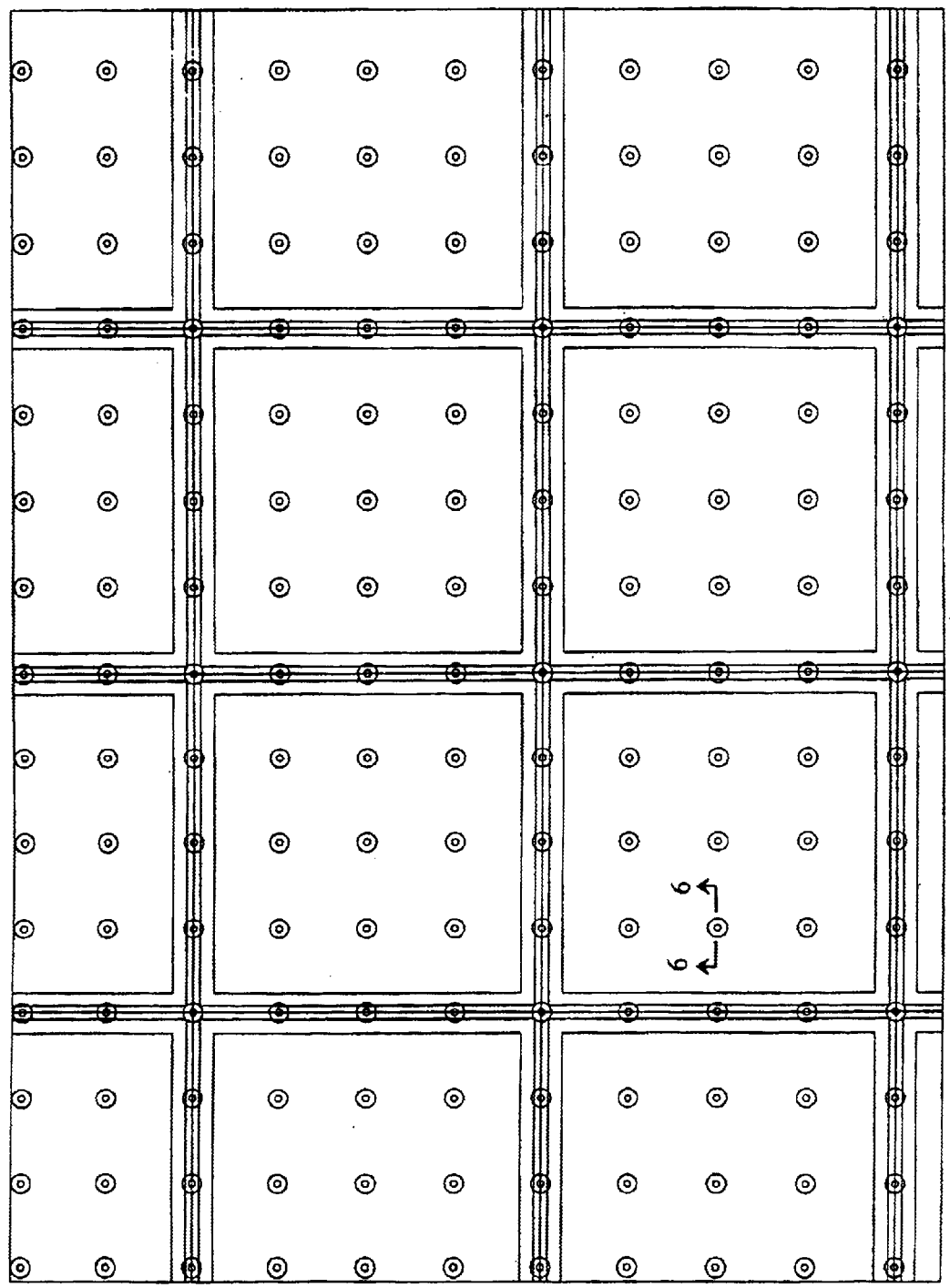
FIG. 5 illustrates an exemplary layout of cathode and anode pads across the front surface of the wafer.

An ideal flatness of the back side surface of the die is very important for many applications, e.g., for CT scanners that require attaching of a scintillator crystal to the back side of the photodiode array. To help satisfy this requirement, the oxide layer 12 is evenly patterned and the metal pads 14 contacting the first electrode 2 and second electrode 8 are evenly spaced across the surface of the die 16 and made the same size to provide identical ball bumping conditions throughout the wafer (see FIGS. 5 and 6). The oxide layer 12 and metal pads 14 are represented by the larger diameter circles in FIG. 5, with the smaller diameter circles describing the contact openings.

The present invention photodiode arrays exhibit very low cross talk because of the excellent isolation of each pixel. Also, because of the small depletion volume, the arrays exhibit low noise and low temperature sensitivity. When used in X-ray systems, they exhibit low radiation damage, and have thermal characteristics similar to scintillators to which they will are mounted. The technique of using a deep diffusion in conjunction with a thin substrate for making electrical contact to the back side of the substrate may, of course be used in other semiconductor devices. While the deep diffusion in the preferred embodiment is of the same conductivity type as the substrate, this is not a limitation of the invention, as the deep diffusion may be of the opposite conductivity type, if desired.

While preferred exemplary embodiments of the present invention have been disclosed herein, such disclosure is only for purposes of understanding the exemplary embodiments and not by way of limitation of the invention. It will be obvious to those skilled in the art that various changes in fabrication process and structure of the photodiode arrays may be made without departing from the spirit and scope of the invention, as set out in the full scope of the following claims.

What is claimed is:

1. A back illuminated photodiode array comprising:

a substrate of a first conductivity type having first and second surfaces;

the second surface having a layer of the first conductivity type having a greater conductivity than the substrate;

a matrix of regions of a first conductivity type of a higher conductivity than the substrate extending from the first surface of the substrate to the layer of the first conductivity type having a greater conductivity than the substrate, wherein the entire matrix regions are semiconductor doped regions;

a plurality of regions of the second conductivity type interspersed within the matrix of regions of the first conductivity type and not extending to the layer of the first conductivity type on the second surface of the substrate; and, a plurality of contacts on the first surface for making electrical contact to the matrix of regions of the first conductivity type and the plurality of regions of the second conductivity type to result back illuminated photodiode array.

2. The photodiode array of claim 1 wherein the plurality of regions of the second conductivity type are separated from the second surface of the substrate by an amount that approximately equals the depletion depth for the substrate at zero bias.

3. The photodiode array of claim 1 wherein the plurality of regions of the second conductivity type are separated from the second surface of the substrate by approximately 9 $\mu$m.

4. The photodiode array of claim 2 wherein the substrate is an n-type silicon substrate having a resistivity of approximately 400 ohm-cm.

5. The photodiode array of claim 1 wherein the plurality of contacts are a plurality of ball grid contacts.

6. The photodiode array of claim 5 wherein the plurality of contacts are of substantially equal size evenly distributed across the photodiode array.

7. The photodiode array of claim 1 wherein the matrix of regions of a first conductivity type comprise a rectangular matrix defining an X-Y matrix of square regions, each square region containing a respective one of the plurality of regions of the second conductivity type.

8. The photodiode array of claim 7 wherein doping forming the matrix of regions of a first conductivity type and the plurality of regions of the second conductivity type overlap.

9. The photodiode array of claim 1 wherein the substrate has a thickness of less than approximately 50 $\mu$m.

10. The photodiode array of claim 1 wherein the substrate has a thickness of approximately 30 $\mu$m.

11. The photodiode array of claim 1 wherein the substrate is a silicon substrate.

12. A back illuminated photodiode array comprising:

a substrate of a first conductivity type having first and second surfaces and a thickness of less than approximately 50 $\mu$m;

the second surface having a layer of the first conductivity type having a greater conductivity than the substrate;

a rectangular matrix of regions of a first conductivity type of a higher conductivity than the substrate extending from the first surface of the substrate to the layer of the first conductivity type on the second surface of the substrate, the rectangular matrix defining an X-Y matrix of rectangular regions, wherein rectangular matrix of regions are semiconductor doped regions;

a plurality of regions of the second conductivity type interspersed within the matrix of regions of the first conductivity type, each region of the second conductivity type being within a respective square region defined by the rectangular matrix of regions of a first conductivity type; and, a plurality of contacts on the first surface for making electrical contact to the matrix of regions of the first conductivity type and the plurality of regions of the second conductivity type to result back illuminated photodiode array.

13. The photodiode array of claim 12 wherein the plurality of regions of the second conductivity type are separated from the second surface of the substrate by an amount that approximately equals the depletion depth for the substrate at zero bias.

14. The photodiode array of claim 13 wherein the plurality of regions of the second conductivity type are separated from the second surface of the substrate by approximately 9 $\mu$m.

15. The photodiode array of claim 13 wherein the substrate is an n-type silicon substrate having a resistivity of approximately 400 ohm-cm.

16. The photodiode array of claim 12 wherein the plurality of contacts are a plurality of ball grid contacts.

17. The photodiode array of claim 16 wherein the plurality of contacts are of substantially equal size substantially evenly distributed across the photodiode array.

18. The photodiode array of claim 12 wherein doping forming the matrix of regions of a first conductivity type and the plurality of regions of the second conductivity type overlap.

19. The photodiode array of claim 12 wherein the substrate has a thickness of approximately 30 $\mu$m.

20. The photodiode array of claim 12 wherein the substrate is a silicon substrate.

* * * * *